(12) United States Patent
Shinohara (10) Patent No.: US 9,197,832 B2
(45) Date of Patent: Nov. 24, 2015

(54) SOLID-STATE IMAGE PICKUP APPARATUS AND DRIVE METHOD THEREFOR

(75) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 102 days.

(21) Appl. No.: 13/696,902

(22) PCT Filed: May 6, 2011

(86) PCT No.: PCT/JP2011/002548
§ 371 (c)(1),
(2), (4) Date: Nov. 8, 2012

(87) PCT Pub. No.: WO2011/142104
PCT Pub. Date: Nov. 17, 2011

(65) Prior Publication Data
US 2013/0056619 A1    Mar. 7, 2013

(30) Foreign Application Priority Data

May 10, 2010    (JP) .................................. 2010-108786

(51) Int. Cl.
*H01L 27/00* (2006.01)
*H01J 40/14* (2006.01)
(Continued)

(52) U.S. Cl.
CPC ............ *H04N 5/3745* (2013.01); *H01L 27/146* (2013.01); *H01L 27/14609* (2013.01); *H01L 27/14643* (2013.01); *H04N 5/378* (2013.01); *H04N 5/3741* (2013.01)

(58) Field of Classification Search
CPC ............ H01L 27/146; H01L 27/14609; H01L 27/14643; H04N 5/378; H04N 5/3745
USPC ..... 250/208.1, 214 SW, 214 R, 214.1, 214 A, 250/214 LS; 348/294–301, 272; 257/291, 257/414, 431, 443, 444, 451, 461, 462
See application file for complete search history.

(56) References Cited

U.S. PATENT DOCUMENTS

| | | | |
|---|---|---|---|
| 5,604,364 A | * | 2/1997 | Ohmi et al. .................... 257/291 |
| 7,479,675 B2 | * | 1/2009 | Adachi .......................... 257/292 |

(Continued)

FOREIGN PATENT DOCUMENTS

| | | |
|---|---|---|
| CN | 1496112 A | 5/2004 |
| EP | 708552 A2 | 4/1996 |

(Continued)

*Primary Examiner* — Pascal M Bui Pho
*Assistant Examiner* — Mitchell Oestreich
(74) *Attorney, Agent, or Firm* — Canon USA, Inc. IP Division (57) ABSTRACT

A solid-state image pickup apparatus of the present invention includes a plurality of pixels arranged in a matrix. For the convenience sake, among the plurality of pixels, two pixels from which signals are not read in parallel are set to be a first pixel and a second pixel. A first reset transistor is disposed in an electrical path between a first reset power supply line and the control electrode of an amplifying transistor contained in the first pixel. A second reset transistor is disposed in an electrical path between the control electrode of the amplifying transistor contained in the first pixel and the control electrode of an amplifying transistor contained in the second pixel. A third reset transistor is disposed in an electrical path between the control electrode of the amplifying transistor contained in the second pixel and a second reset power supply line.

14 Claims, 7 Drawing Sheets

(51) Int. Cl.
*H04N 5/3745* (2011.01)
*H01L 27/146* (2006.01)
*H04N 5/378* (2011.01)
*H04N 5/374* (2011.01)

(56) References Cited

U.S. PATENT DOCUMENTS

| | | | |
|---|---|---|---|
| 7,745,773 B1 * | 6/2010 | Merrill | 250/208.1 |
| 2002/0066849 A1 * | 6/2002 | Guidash et al. | 250/208.1 |
| 2007/0091190 A1 * | 4/2007 | Iwabuchi et al. | 348/294 |
| 2008/0303929 A1 * | 12/2008 | Morimoto et al. | 348/300 |
| 2009/0159945 A1 * | 6/2009 | Okita et al. | 257/292 |
| 2010/0118167 A1 * | 5/2010 | Johnson | 348/294 |
| 2010/0208115 A1 * | 8/2010 | Sugawa et al. | 348/308 |

FOREIGN PATENT DOCUMENTS

| | | |
|---|---|---|
| EP | 0708555 A2 | 4/1996 |
| EP | 1391933 A2 | 2/2004 |
| JP | 63-186466 A1 | 8/1988 |
| JP | 2004-104116 A | 4/2004 |

\* cited by examiner

SOLID-STATE IMAGE PICKUP APPARATUS AND DRIVE METHOD THEREFOR

TECHNICAL FIELD

The present invention relates to solid-state image pickup apparatuses, and more particularly, to an amplifying solid-state image pickup apparatus and a drive method therefor.

BACKGROUND ART

These days, as solid-state image pickup apparatuses, amplifying solid-state image pickup apparatuses (hereinafter referred to as "active pixel sensors, APS") provided with signal amplifying functions for pixels are attracting people's attention. PTL 1 discloses the following configuration of an APS. The control electrodes of a plurality of amplifying bipolar transistors contained in pixels disposed in the row direction are connected in series by reset metal oxide semiconductor (MOS) transistors. In this configuration, reset power supply lines are provided at the reset MOS transistors disposed at the ends.

In recent solid-state image pickup apparatuses, ten million or more pixels are disposed in a matrix. In order to improve the readout speed, a plurality of pixels disposed in the row direction are reset substantially at the same time, and signals are read in parallel. In the configuration in which the control electrodes of a plurality of amplifying bipolar transistors are connected in series in the row direction by reset MOS transistors, parasitic capacitance of the control electrodes and the ON resistance of the reset MOS transistors are increased by an amount as large as several times the number of pixels in the row direction. Accordingly, the time necessary for resetting the control electrodes becomes longer. Thus, if such a solid-state image pickup apparatus is applied to an image sensor having a large number of pixels in one row, it is difficult to deal with restrictions of the drive time.

CITATION LIST

Patent Literature

PTL 1: Japanese Patent Laid-Open No. 63-186466

SUMMARY OF INVENTION

According to one aspect of the present invention, there is provided a solid-state image pickup apparatus including: a plurality of pixels arranged in a matrix, each including a photoelectric conversion unit and an amplifying transistor having a control electrode to which electric charge generated in the photoelectric conversion unit is transferred; a plurality of output lines, signals from at least two pixels of the plurality of pixels being output, in parallel, to the plurality of output lines; a first reset power supply unit and a second reset power supply unit configured to supply a voltage for resetting the control electrode of the amplifying transistor; and a first reset transistor, a second reset transistor and a third reset transistor. The plurality of pixels include a first pixel and a second pixel, signals from the first pixel and the second pixel not being output in parallel. The first reset transistor controls an electrical connection between the first reset power supply unit and the control electrode of the amplifying transistor of the first pixel. The second reset transistor controls an electrical connection between the control electrode of the amplifying transistor of the first pixel and the control electrode of the amplifying transistor of the second pixel. The third reset transistor controls an electrical connection between the control electrode of the amplifying transistor of the second pixel and the second reset power supply unit.

According to another aspect of the present invention, there is provided a solid-state image pickup apparatus including: a first pixel and a second pixel, each including a photoelectric conversion unit and an amplifying transistor having a control electrode to which electric charge generated in the photoelectric conversion unit is transferred; an output line to which signals from the first pixel and the second pixel are output; a first reset power supply unit and a second reset power supply unit configured to supply a voltage for resetting the control electrode of the amplifying transistor; a first reset transistor configured to control an electrical connection between the first reset power supply unit and the control electrode of the amplifying transistor of the first pixel; a second reset transistor configured to control an electrical connection between the control electrode of the amplifying transistor of the first pixel and the control electrode of the amplifying transistor of the second pixel; and a third reset transistor configured to control an electrical connection between the control electrode of the amplifying transistor of the second pixel and the second reset power supply unit.

According to still another aspect of the present invention, there is provided a drive method for a solid-state image pickup apparatus which includes: a first pixel and a second pixel, each including a photoelectric conversion unit and an amplifying transistor having a control electrode to which electric charge generated in the photo-electric conversion unit is transferred;

an output line to which signals from the first pixel and the second pixel are output; a first reset power supply unit and a second reset power supply unit configured to supply a voltage for resetting the control electrode of the amplifying transistor; a first reset transistor configured to control an electrical connection between the first reset power supply unit and the control electrode of the amplifying transistor of the first pixel; a second reset transistor configured to control an electrical connection between the control electrode of the amplifying transistor of the first pixel and the control electrode of the amplifying transistor of the second pixel; and a third reset transistor configured to control an electrical connection between the control electrode of the amplifying transistor of the second pixel and the second reset power supply unit. The amplifying transistor is of a first conductivity type, and the first reset transistor and the second reset transistor are of a second conductivity type, which is opposite to the first conductivity type, and the control electrode of the amplifying transistor of the first pixel is connected to a main electrode of the first reset transistor and a main electrode of the second reset transistor. The drive method includes: when transferring the electric charge to the control electrode of the amplifying transistor of the first pixel, setting the control electrode of the amplifying transistor of the first pixel in an electrically floating state by setting the first reset transistor and the second reset transistor to be in a non-conductive state; and applying a reset voltage to the control electrode of the amplifying transistor of the second pixel by setting the third reset transistor to be in a conductive state.

The present invention provides a solid-state image pickup apparatus that can achieve a fast resetting operation.

Further features of the present invention will become apparent from the following description of exemplary embodiments with reference to the attached drawings.

DESCRIPTION OF EMBODIMENTS

Figure 1:
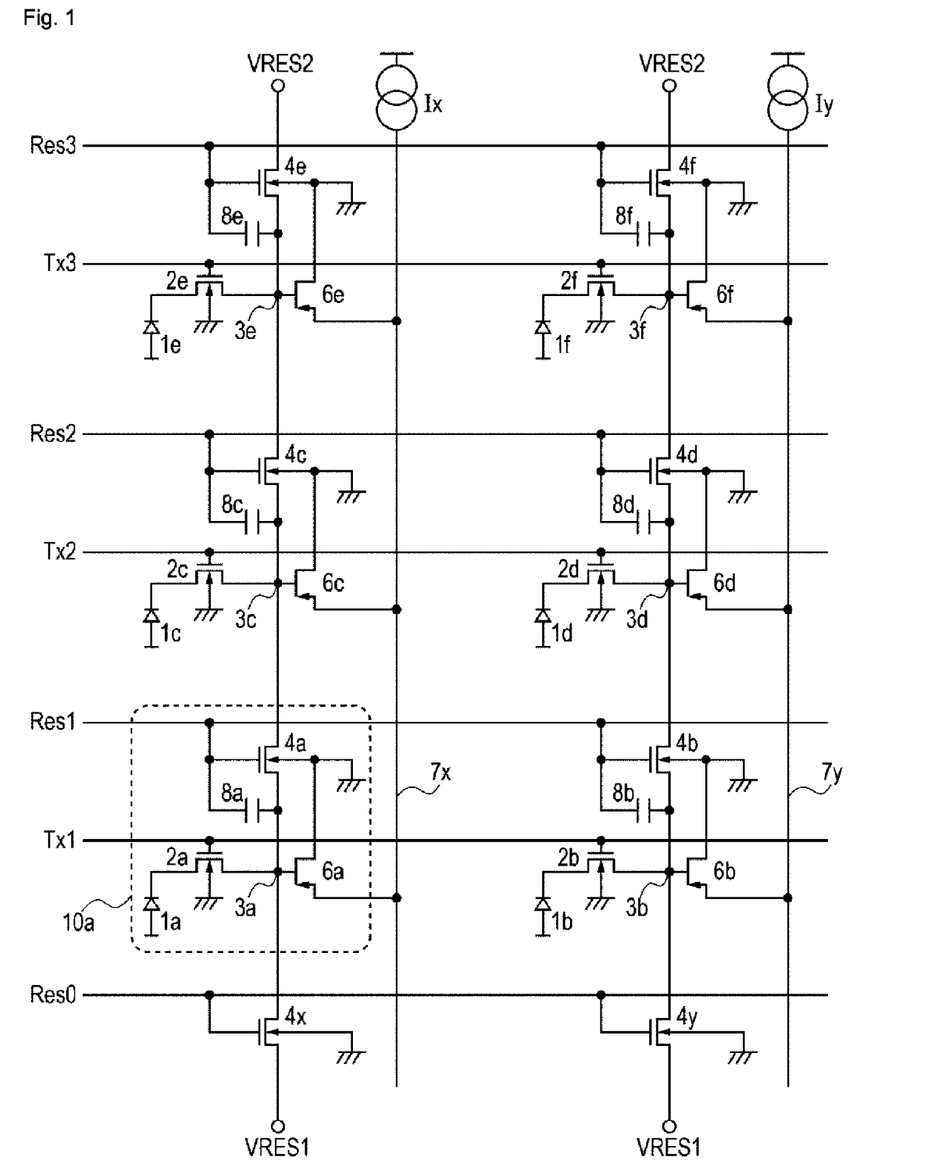
FIG. 1 is an equivalent circuit diagram illustrating pixels of a solid-state image pickup apparatus according to a first embodiment of the present invention.

Embodiments of the present invention are described in detail below with reference to the drawings. FIG. 1 is an equivalent circuit diagram illustrating a solid-state image pickup apparatus according to a first embodiment of the present invention. In FIG. 1, the elements surrounded by the broken lines are contained in one pixel 10a. The equivalent circuit diagram in FIG. 1 shows a configuration in which six pixels are disposed in three rows and two columns. The elements having similar functions in each pixel 10 are designated by like reference numerals, and are differentiated by adding different alphabetical characters to the corresponding numerals for the elements of the individual pixels 10. The present invention is not restricted to the above-described number of pixels, and it suffices that a plurality of pixels are disposed in a matrix.

The elements forming each pixel 10 of the solid-state image pickup apparatus shown in FIG. 1 are described below. A photoelectric conversion unit 1, for example, a photodiode, generates electric charge. A transfer MOS transistor 2 transfers electric charge generated in the photoelectric conversion unit 1. A control electrode 3 of an amplifying transistor 6 receives electric charge generated in the photoelectric conversion unit 1. A reset MOS transistor 4 is used for applying a reset voltage to the control electrode 3. The transfer MOS transistor 2 and the reset MOS transistor 4 are of the N conductivity type. The amplifying transistor 6, for example, a P-type junction field effect transistor (hereinafter referred to as the "JFET"), amplifies signal charge generated in the photoelectric conversion unit 1. A coupling capacitor 8 is disposed between the gate of the reset MOS transistor 4 and the control electrode 3. An output signal line 7 is connected to a constant-current source I, and forms a source follower together with the amplifying transistor 6, which is a P-type JFET.

A reset pulse Res is input into the gate of the reset MOS transistor 4, while a transfer pulse Tx is input into the gate of the transfer MOS transistor 2. The reset MOS transistor 4 and the transfer MOS transistor 2 can be controlled to be either of the conductive state or the non-conductive state by the reset pulse Res and the transfer pulse Tx, respectively. Reset power supply lines VRES1 and VRES2 are provided for the pixels 10 disposed at the ends of a matrix in the column direction so as to supply a reset voltage for resetting the control electrodes 3. The reset power supply lines VRES1 and VRES2 may also be used for resetting the photoelectric conversion unit 1.

A signal output from the amplifying transistor 6 of each pixel 10 is read out to the output signal line 7. In this embodiment, in order to achieve fast signal processing, signals from the pixels 10a and 10b, which are disposed in the row direction, are read out to the output signal lines 7x and 7y, respectively, in parallel. Similarly, signals from the pixels 10c and 10d are read out to the output signal lines 7x and 7y, respectively, in parallel, and then, signals from the pixels 10e and 10f are read out to the output signal lines 7x and 7y, respectively, in parallel. Signals from the pixels 10a, 10c, and 10e, which are disposed in the column direction, are not read out in parallel.

In this embodiment, the reset MOS transistor 4a is disposed in an electrical path between the control electrodes 3a and 3c of the amplifying transistors 6a and 6c of the two pixels 10a and 10c, respectively, which are disposed in the column direction. The reset MOS transistor 4a controls an electrical connection between the control electrode 3a of the amplifying transistor 6a and the control electrode 3c of the amplifying transistor 6c. A reset MOS transistor 4x is disposed in an electrical path between the control electrode 3a of the amplifying transistor 6a and the reset power supply line VRES1. The reset MOS transistor 4x controls an electrical connection between the control terminal 3a of the amplifying transistor 6a and the reset power supply line VRES1. A reset MOS transistor 4c is disposed in an electrical path between the control electrode 3c of the amplifying transistor 6c and the reset power supply line VRES2. The reset MOS transistor 4c controls an electrical connection between the control electrode 3c of the amplifying transistor 6c and the reset power supply line VRES2. Similarly, a reset MOS transistor is disposed between the control electrodes of the amplifying transistors contained in adjacent pixels or between the control electrode and the corresponding reset power supply line so as to electrically connect the control electrodes of the adjacent pixels or the control electrode and the reset power supply line.

In this manner, the control electrodes 3 of the amplifying transistors 6 contained in a plurality of pixels from which signals are not read out in parallel are connected in series in the column direction by the reset MOS transistors 4. Among the plurality of control electrodes 3 connected in series, the control electrodes 3 disposed at the ends in the column direction are connected to the reset power supply lines VRES1 and VRES2 by the different reset MOS transistors 4. In this embodiment, therefore, the control electrode 3 of each pixel 10 can be electrically connected to both the first reset power supply unit (reset power supply line VRES1) and the second reset power supply unit (reset power supply line VRES2) via one or more reset MOS transistors 4. The number of reset MOS transistors 4 is greater than the number of pixels contained in each column by one.

In the electrical path between the control electrode 3c and the reset power supply line VRES2, in addition to the reset MOS transistor 4c, as shown in FIG. 1, the control electrode 3e and the reset MOS transistor 4e are disposed. In this manner, in the electrical path for which the reset MOS transistor 4c controls electrical connection, other elements may be disposed. For example, in a solid-state image pickup apparatus in which ten million or more pixels are disposed in a matrix, between the control electrode of a certain pixel and a reset power supply unit, the control electrodes of amplifying transistors and reset transistors contained in several thousands of pixels may be disposed.

With the configuration having the control electrodes 3 and the reset MOS transistors 4 shown in FIG. 1, when performing a resetting operation, it is sufficient that only one control electrode in each column is reset. Thus, parasitic capacitance and stray resistance are small. This will be discussed in detail later.

Figure 2:
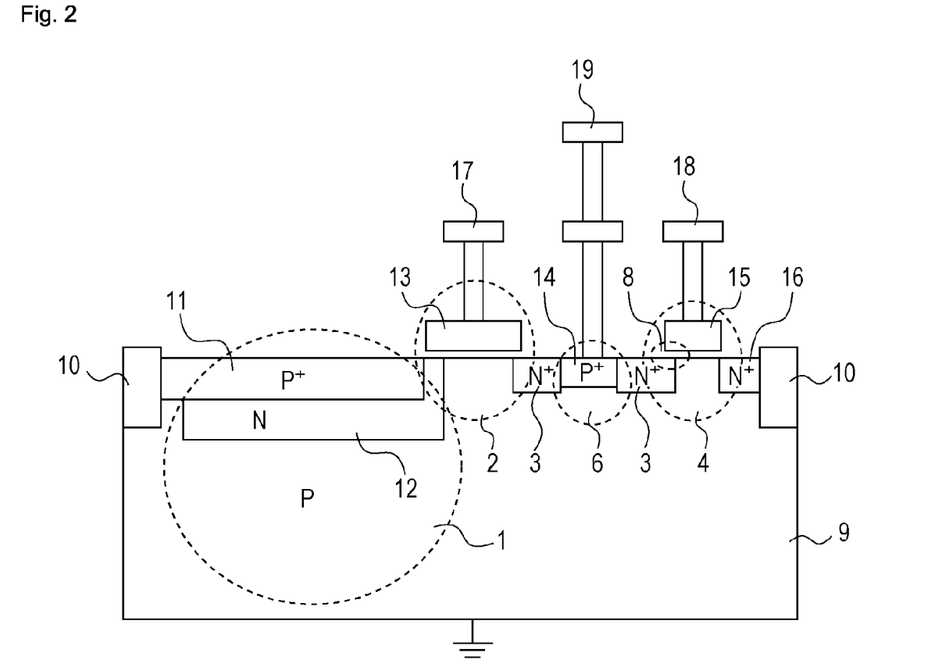
FIG. 2 is a sectional view illustrating the structure of a pixel of the solid-state image pickup apparatus according to the first embodiment of the present invention.

FIG. 2 is a sectional diagram schematically illustrating a pixel region in the solid-state image pickup apparatus according to this embodiment. The elements corresponding to those shown in FIG. 1 are designated by like reference numerals. The pixel region is a region in which pixels are disposed in a matrix on a semiconductor substrate. The pixel region may be part of the semiconductor substrate or the entirety of the semiconductor substrate.

In FIG. 2, there are shown a P-type semiconductor region 9, device isolation portions 10 formed of an insulator, a P-type semiconductor region 11 disposed on the light incident surface, and an N-type semiconductor region 12 storing signal charge therein. The P-type semiconductor regions 9 and 11 each form a PN junction with the N-type semiconductor region 12, and the P-type semiconductor regions 9 and 11 and the N-type semiconductor region 12 form the photoelectric conversion unit 1. In FIG. 2, there is also shown a gate electrode 13 of the transfer MOS transistor 2.

The control electrode 3 shown in FIG. 1 is formed of an N-type semiconductor region, and the N-type semiconductor region corresponding to the control electrode 3 is designated by the same reference numeral in FIG. 2. Thereafter, in this specification, when the control electrode means a circuit node, it is referred to as the "control electrode", and when the control electrode means a semiconductor region of a pixel in cross section, it is referred to as the "control electrode region". A P-type semiconductor region 14 is surrounded by the control electrode region 3 in the plane on the same level as the substrate surface. The amplifying transistor 6, which is a P-type JFET, is formed of the P-type semiconductor region 14, which is a source region, the control electrode region 3, and the P-type semiconductor region 9, which is a drain region. The P-type semiconductor region 9 may be the semiconductor substrate itself or a well region formed in the semiconductor substrate.

In FIG. 2, there are also shown a gate electrode 15 of the reset MOS transistor 4 and a control electrode region 16 of an adjacent pixel in the column direction. In this embodiment, in the reset MOS transistor 4 that connects the control electrodes 3 of adjacent pixels, the control electrode region 3 of one pixel serves as the source region of the MOS transistor 4, and the control electrode region 16 of the other pixel serves as the drain region of the MOS transistor 4.

The coupling capacitor 8 is generated in the overlapped portion between the gate electrode 15 of the reset MOS transistor 4 and the control electrode region 3, and contains the gate oxide film of the reset MOS transistor 4. A control line 17 for transferring a transfer pulse Tx is connected to the gate electrode 13. A control line 18 for transferring a reset pulse Res is connected to the gate electrode 15. A signal line 19 is connected to the P-type semiconductor region 14, which is the source region of the amplifying transistor 6. The signal line 19 forms an output signal line to which signals from the amplifying transistors 6 are read out. The control lines 17 and 18 are disposed in the row direction.

In this embodiment, as shown in FIG. 1, the reset power supply lines VRES1 and VRES2 are provided for the pixels disposed at the ends of a matrix in the column direction. With the configuration in which reset power supply units are disposed outside the pixel region, as in this embodiment, it is not necessary to arrange wiring for supplying a reset power supply for the pixel region.

Subsequently, the operation of the solid-state image pickup apparatus according to this embodiment is described below. In this embodiment, it is assumed that, in the initializing state, all the pixels 10 are reset. That is, in this state, all the reset MOS transistors 4 are in the conductive state, and a reset voltage is applied to the control electrodes 3 of all the pixels 10. Then, a row from which signals are read out is selected, and signals output from the pixels 10 contained in the selected row are read out to the corresponding output signal line 7.

Figure 8:
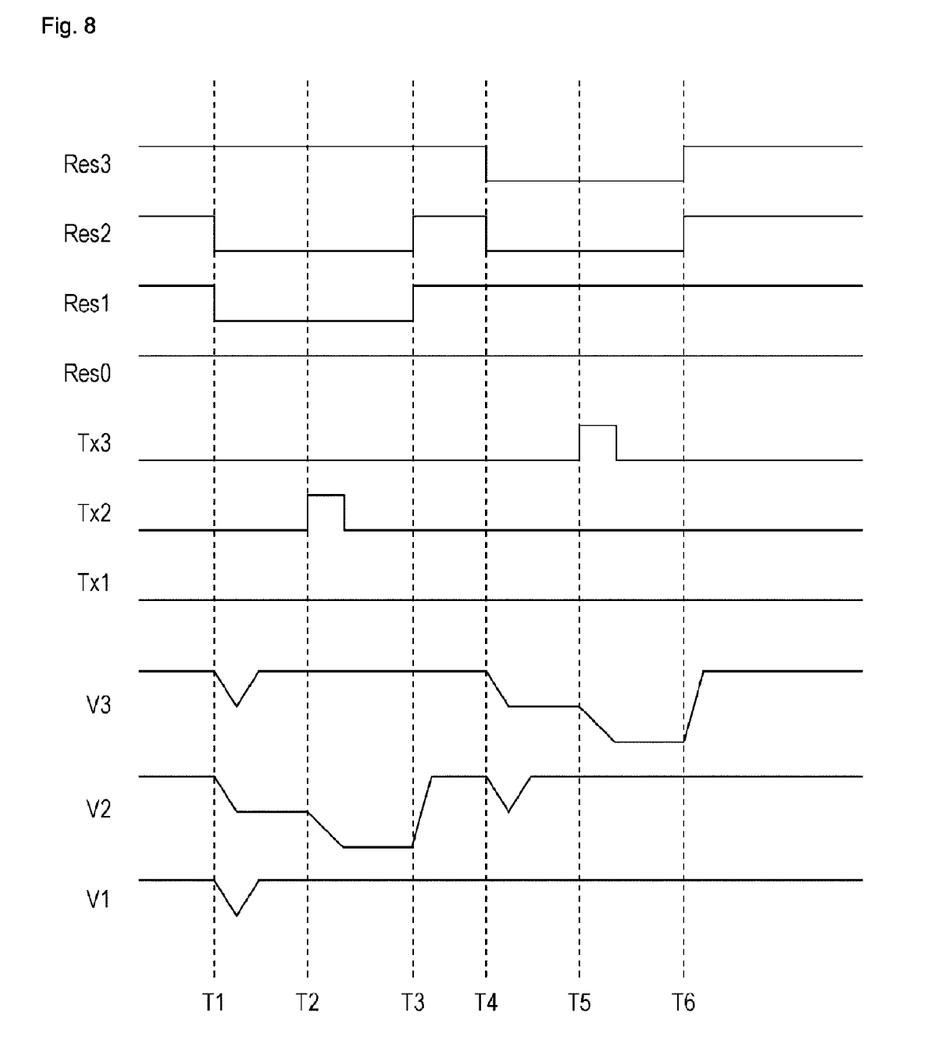
FIG. 8 is a timing chart illustrating pulses for driving the solid-state image pickup apparatus according to the first embodiment of the present invention.

The specific operation is described below with reference to FIG. 8. FIG. 8 shows reset pulses Res0, Res1, Res2, and Res3 input into the gates of the reset MOS transistors 4, and transfer pulses Tx1, Tx2, and Tx3 input into the gates of the transfer MOS transistors 2. Each pulse is input into the gate of the corresponding transistor shown in FIG. 1. A voltage for making the reset MOS transistor 4 and the transfer MOS transistor 2 be in the conductive state is referred to as the "high level", and a voltage for making the reset MOS transistor 4 and the transfer MOS transistor 2 be in the non-conductive state is referred to as the "low level". The high level is set to be, for example, the power supply potential VDD. The low level is set to be, for example, the GND potential or the negative potential. In FIG. 8, potential changes V1, V2, and V3 of the control electrodes 3a, 3c, and 3e, respectively, are schematically shown.

The operation for selecting a row of pixels 10 from which signals are output is first described below. It is necessary that the potential of the control electrodes 3 of the amplifying transistors 6 contained in the pixels 10 in the selected row be in the floating state. Also, in this embodiment, since the amplifying transistors 6 are of the P type, it is necessary that, among the control electrodes 3 of the amplifying transistors 6 of the plurality of pixels 10 connected to the common output signal line 7, the potential of the control electrode 3 of the amplifying transistor 6 of the pixel 10 in the selected row be the lowest. In this state, the constant current supplied from the output signal line 7 flows only in the amplifying transistor 6 of the selected pixel 10, and the potential corresponding to the potential of the control electrode 3 of the amplifying transistor 6 of the selected pixel 10 is output to the output signal line 7 by the source follower operation of the amplifying transistor 6 and the output signal line 7. If the amplifying transistor 6 is of the N type, it is necessary that, among the control electrodes 3 of the amplifying transistors 6 of the plurality of pixels 10 connected to the common output signal line 7, the potential of the control electrode 3 of the amplifying transistor 6 of the pixel 10 in the selected row be the highest.

In this embodiment, the reset potential VRES is the potential between the GND potential and the power supply potential VDD. Before selecting a row, all the reset pulses are at the high level, and all the reset MOS transistors 4 are in the conductive state. Accordingly, the potentials of the control electrodes 3 of all the pixels 10 are set to be the reset potential VRES.

When selecting a certain row of pixels 10, the reset pulses input into the pair of reset MOS transistors 4 sandwiching the control electrode 3 of the pixel 10 in the selected row are set to be at the low level. For example, when selecting the pixels 10c and 10d in the second row, the reset pulses Res1 and Res2 are changed from the high level to the low level, and the reset pulses Res0 and Res3 are maintained at the high level, as indicated by time T1 in FIG. 8. The reset MOS transistors 4a and 4b to which the reset pulse Res1 is input are made to be in the non-conductive state, and the reset MOS transistors 4c and 4d to which the reset pulse Res2 is input are also made to be in the non-conductive state. Accordingly, the potentials of the control electrodes 3 of the pixels 10 in the second row are made to be in the floating state.

In this embodiment, the reset MOS transistors 4 are of the N type, and the potential of the low level is lower than the potential of the high level. When the reset pulses Res1 and Res2 are changed to the low level, the potential of the control electrodes 3 of the pixels 10 contained in the second row is decreased via the coupling capacitors 8 (V2 in FIG. 8). The potentials of the control electrodes 3 of the pixels 10 contained in the first row and the third row adjacent to the second row are also momentarily decreased by being influenced by the potential change due to the reset pulses Res1 and Res2 (V1 and V3 in FIG. 8). However, since the reset pulses Res0 and Res3 are maintained at the high level, the potentials of the control electrodes 3 of the pixels 10 adjacent to the selected pixel 10 are returned to the reset potential VRES. Among the potentials of the pixels 10 connected to the common output signal line 7, the potential of the control electrode 3 of the amplifying transistor 6 of the pixel 10 contained in the second row becomes the lowest. By performing the above-described operation, the second row is selected.

In this embodiment, the two reset MOS transistors 4 directly connected to the control electrode 3 of the selected pixel are made to be in the non-conductive state, and the other reset MOS transistors 4 are made to be in the conductive state, whereby the potential of the control electrode 3 of the selected pixel 10 can be controlled via the coupling capacitor 8.

After selecting the pixels 10 in the second row, a high level pulse is supplied to the transfer pulse Tx2 at time T2 in FIG. 8, and electric charge in the photoelectric conversion unit 1 is transferred to the control electrode 3. The amount by which the potential of the control electrode 3 is decreased is determined by the amount of electric charge generated in the photoelectric conversion unit 1. The transfer pulses supplied to the transfer MOS transistors 2 are Tx1, Tx2, and Tx3 in order from the bottom in FIG. 1. After transferring electric charge to the control electrode 3, the output in accordance with the potential of the control electrode 3 is read out to the output signal line 7.

Subsequently, the resetting operation for each pixel is described below. The potential of the reset power supply lines is the potential VRES between the high level and the low level.

As discussed above, the high level pulse is applied to the gates of the reset MOS transistors 4, except for the reset MOS transistors 4 disposed adjacent to the selected pixel 10. More specifically, during the period between T1 and T3 in FIG. 8, the reset pulses Res0 and Res3 are at the high level, while the reset pulses Res1 and Res2 applied to the reset MOS transistors 4 adjacent to the selected pixel 10 are at the low level. Accordingly, the reset MOS transistors 4x, 4y, 4e, and 4f in FIG. 1 are in the conductive state, while the potentials of the control electrodes 3 (V1 and V3) of the pixels 10 which are not selected are maintained at the reset potential VRES.

Upon completion of the readout operation of the selected row, at time T3 in FIG. 8, the pair of the reset MOS transistors 4 sandwiching the pixel 10 in the row for which the readout operation has been completed are made to be in the conductive state. This makes it possible to reset the potential of the control electrode 3 of the pixel 10 from which the signal has been read to the reset potential VRES.

At time T4 in FIG. 8, the gate potential of a pair of reset MOS transistors 4 sandwiching the pixel 10 in a subsequent row is changed to the low level. In this embodiment, in order to select the third row, the reset pulses Res2 and Res3 are changed to the low level, and the other reset pulses Res0 and Res1 are maintained at the high level.

Thereafter, at time T5 in FIG. 8, signal charge is transferred from the photoelectric conversion units 1, and the signals from the pixels 10 contained in the third row are read out in parallel. Then, at time T6 in FIG. 8, the reset pulses Res2 and Res3 are changed to the high level, whereby the control electrodes 3 of the pixels 10 contained in the third row are reset.

In this manner, the resetting operation is performed for each row in parallel. However, in terms of each column, it is sufficient that only one control electrode 3 is reset to the reset potential VRES at one time. Thus, parasitic capacitance and the ON resistance of the reset MOS transistor 4 per pixel are small, thereby achieving a fast resetting operation.

Transferring signal charge from the photoelectric conversion unit 1 to the control electrode 3 by the transfer MOS transistor 2 and eliminating noise caused by the offset variation in the individual pixels or caused by the resetting operation can be performed by the use of a known technique, and an explanation thereof is thus omitted.

As discussed above, in this embodiment, a reset MOS transistor 4 is disposed in the electrical path between the control electrodes 3 of two pixels 10 that are not subjected to the readout operation at the same time. Then, a reset MOS transistor 4 is disposed in the electrical path between the control electrode 3 of the first pixel and the first reset power supply unit, and a reset MOS transistor 4 is disposed in the electrical path between the control electrode 3 of the second pixel and the second reset power supply unit. With this configuration, parasitic capacitance and stray resistance generated when the control electrodes 3 of the amplifying transistors 6 are reset can be small, thereby achieving a fast resetting operation.

In this embodiment, the reset power supply lines are not disposed in the pixel region. Accordingly, the area of the photoelectric conversion unit, such as a photodiode, can be made large. Additionally, with a small number of wiring lines, the aperture of the photoelectric conversion unit can be made large. With this configuration, the sensitivity of the pixels can be enhanced.

In this embodiment, as shown in FIG. 2, the P-type semiconductor region 9 serves as the drain region of the amplifying transistor 6, which is a P-type JFET. The GND potential, i.e., the drain potential of the amplifying transistor 6, is supplied from the semiconductor substrate. With this configuration, it is not necessary that a drain power supply line for supplying a voltage to the drain of the amplifying transistor 6 be provided for the surface of the pixel region, thereby further enhancing the sensitivity of the pixels.

In this embodiment, JFETs are used as the amplifying transistors 6. Generally, noise of JFETs is smaller than that of MOS transistors. With this configuration, images having low noise can be captured.

According to the first embodiment of the present invention, it is possible to provide a fast, high-sensitivity, low-noise amplifying solid-state image pickup apparatus.

Modifications made to the first embodiment are described below.

The solid-state image pickup apparatus according to the first embodiment of the present invention includes pixels. Each pixel includes a photoelectric conversion unit, such as a photodiode, and an amplifying transistor for amplifying a signal generated in the photoelectric conversion unit. Each pixel may also include a transfer transistor for transferring signal charge stored in the photodiode, as described in the first embodiment by way of example. Each pixel may also include a selection transistor for selectively outputting a signal from the amplifying transistor.

In the first embodiment, the reset power supply lines VRES1 and VRES2 for supplying reset voltages are used as the reset voltage supply units. However, the reset voltage supply units may be formed of pad electrodes, and power may be externally supplied.

As the amplifying transistors 6, at least one of MOS transistors, bipolar transistors, JFETs, and static induction transistors (hereinafter referred to as "SITs") may be selected. The amplifying transistor 6 may desirably be a transistor whose control electrode region is a semiconductor region that can be directly used as a control electrode, more specifically, the amplifying transistor 6 may desirably a JFET or a SIT.

In the first embodiment, as shown in FIG. 2, the control electrode 3 of the amplifying transistor 6 is a semiconductor region itself forming the control electrode 3. The control electrode 3 of the amplifying transistor 6 may be configured such that a conductive material electrode made of a conductive material, such as a metal or polysilicon, is electrically connected to a floating diffusion (hereinafter referred to as the "FD") formed of a semiconductor region. For example, if the amplifying transistor 6 is formed of a MOS transistor, it is formed by connecting an FD and a gate electrode.

If a JFET or a SIT is used as the amplifying transistor 6, signal charge stored in the photoelectric conversion unit 1 may desirably be the same as the majority carrier of the control electrode region of the amplifying transistor 6. If the conductivity type of one of the main electrodes of the transfer transistors 2 is different from that of the other, it is difficult to form the transfer transistors 2. Accordingly, the conductivity type of the transfer transistor 2 is opposite to that of the amplifying transistor 6.

If a MOS transistor is used as the amplifying transistor 6, in order to make the conductivity type of the amplifying transistor 6 opposite to that of the reset transistor 4, different conductivity-type wells are formed in each pixel, and different conductivity-type MOS transistors are disposed in the wells. It may be difficult to form such a structure in a small pixel due to limitations of space. If the size of a pixel is large, the amplifying transistor 6 may be a MOS transistor having a conductivity type opposite to that of the reset transistor 4.

In the present invention, the conductivity type of the amplifying transistor 6 is not particularly restricted. If the N-type amplifying transistor is used, the readout speed is faster than that of the P-type amplifying transistor.

The solid-state image pickup apparatus according to the first embodiment of the present invention includes a plurality of reset transistors 4 for resetting the control electrode 3 of the amplifying transistor 6 of each pixel. Although the reset transistors 4 are MOS transistors in the first embodiment, another type of transistor may be used. Modifications made to the arrangement of the reset transistors 4 are described below.

The reset transistors 4 can desirably be disposed so that they connect in series the control electrodes 3 of a plurality of amplifying transistors 6 from which signals are read out to one output signal line 7. If, among a plurality of pixels disposed in a matrix, a plurality of pixels contained in one column are connected to two or more output signal lines, the reset transistors 4 are disposed so that they connect in series the control electrodes 3 of the amplifying transistors 6 of a plurality of pixels from which signals are not read out in parallel.

Figure 6A:
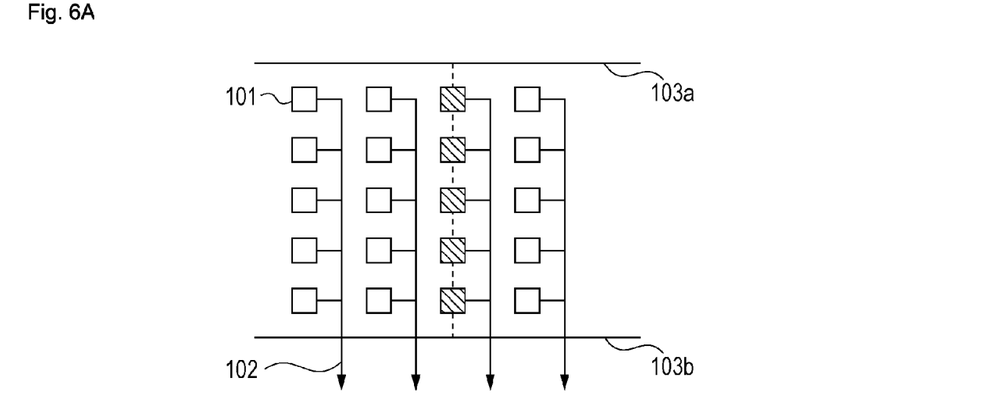
FIG. 6A is a schematic view illustrating an arrangement of pixels of a solid-state image pickup apparatus according to the present invention.
Figure 6B:
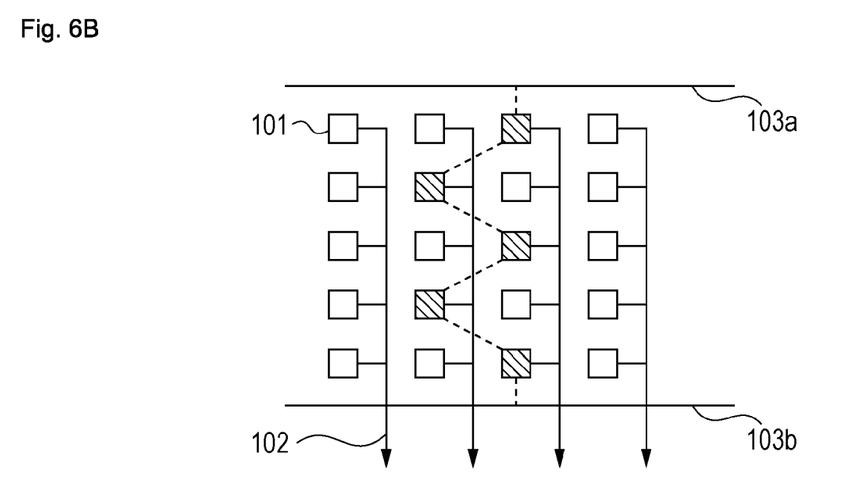
FIG. 6B is a schematic view illustrating another arrangement of pixels of a solid-state image pickup apparatus according to the present invention.
Figure 6C:
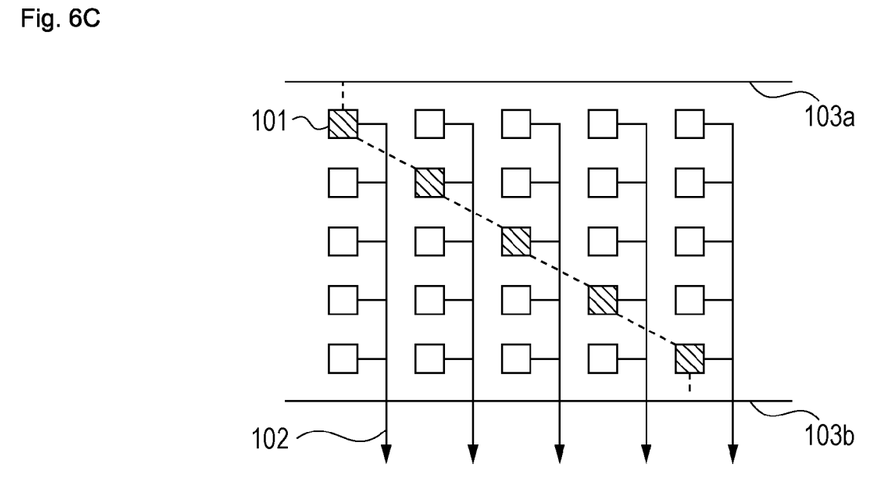
FIG. 6C is a schematic view illustrating still another arrangement of pixels of a solid-state image pickup apparatus according to the present invention.

FIGS. 6A, 6B, and 6C are schematic diagrams illustrating the arrangements of pixels and the connections between the individual pixels and output signal lines. A pixel 101 corresponds to, for example, the pixel 10a shown in FIG. 1. In FIGS. 6A, 6B, and 6C, the configuration in which a plurality of pixels are arranged in a matrix is shown by way of example. A plurality of output signal lines 102 are disposed so that signals can be read out from a plurality of pixels contained in one row in parallel. In FIGS. 6A, 6B, and 6C, there are also shown first and second reset power supply lines 103a and 103b.

A plurality of pixels whose control electrodes of the amplifying transistors are connected in series via the plurality of reset transistors (not shown) are indicated by the hatched portions so that they can be differentiated from the other pixels. The broken lines indicate that the control electrodes of the amplifying transistors of certain pixels are connected via the plurality of reset transistors. The control electrodes of the amplifying transistors of a plurality of pixels from which signals are read out to one output signal line are connected in series, as shown in FIG. 6A, via the plurality of reset transistors. As an example of such an arrangement, in FIG. 6A, the control electrodes of the amplifying transistors of a plurality of pixels contained in each column are connected in series via the plurality of corresponding reset transistors.

Alternatively, as shown in FIGS. 6B and 6C, the control electrode regions of the amplifying transistors of pixels that are not connected to the same output signal line may be connected in series. That is, among a plurality of pixels, the control electrodes of the amplifying transistors of pixels from which signals are not read out in parallel are connected to each other in series. In other words, a plurality of reset transistors are disposed so that they connect in series the control electrodes of the amplifying transistors of a predetermined number of pixels.

Among a plurality of pixels connected in series, the control electrodes of the amplifying transistors of the two pixels disposed at the ends are connected to the first and the second reset power supply lines via different reset transistors. A voltage for resetting the control electrodes of the amplifying transistors of the pixels is supplied to the first and second reset power supply lines.

Figure 7:
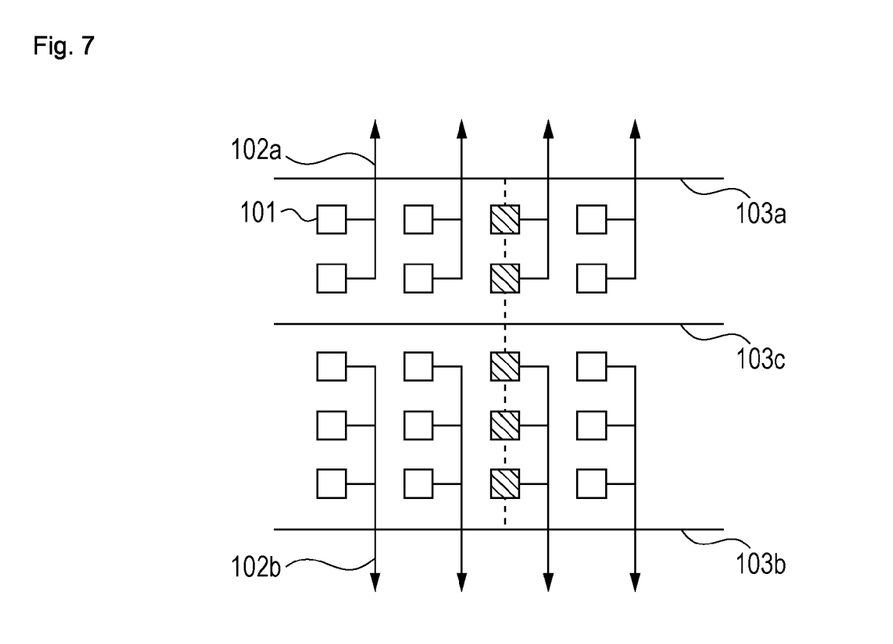
FIG. 7 is a schematic view illustrating yet another arrangement of pixels of a solid-state image pickup apparatus according to the present invention.

Further, as shown in FIG. 7, three reset power supply lines 103a, 103b, and 103c are disposed, and the control electrodes of the amplifying transistors of the pixels disposed between the reset power supply lines may be connected in series via the reset transistors. In such a configuration, a reset power supply line is disposed in the pixel region.

In the configuration shown in FIG. 7, among pixels contained in one column, an output signal line 102a to which signals of some pixels in one column are read out is different from another output signal line 102b to which signals of the other pixels in the same column are read out. Accordingly, some pixels contained in one column can be read out in parallel. For example, in FIG. 7, a signal from the pixel in the second row from the top may be read out, in parallel, together with a signal from the pixel in one of the third through the fifth rows from the top.

Alternatively, a plurality of output signal lines may be disposed for one column. For example, a first output signal line and a second output signal line are disposed for the first column. Among the plurality of pixels contained in the first column, signals from the pixels in the odd-numbered rows are read out to the first output signal line, while signals from the pixels in the even-numbered rows are read out to the second output signal line. With this configuration, signals from pixels contained in a plurality of rows can be read out in parallel. Thus, an even faster readout operation can be achieved.

In the configuration in which a plurality of output signal lines are provided for one column, there may be two pixels which are contained in different rows but are read out in parallel. Accordingly, there may be the case where the control electrodes of the amplifying transistors of pixels from which signals are read out in parallel are connected via the reset transistors. Even in this case, if, among a plurality of pixels whose control electrodes of the amplifying transistors are connected in series via the reset transistors, there are two pixels from which signals are not read out in parallel, the advantages of the present invention can still be obtained. This is because parasitic capacitance and stray resistance can be smaller than those when the control electrodes of the amplifying transistors of all the pixels are reset at the same time. Thus, a fast resetting operation can be implemented.

Reset transistors are disposed so as to connect the control electrodes of amplifying transistors in series. To implement such an arrangement, the following configuration may be taken. The control electrodes of the amplifying transistors of two pixels may be connected by one reset transistor. Additionally, the control electrode of the amplifying transistor of each of the two pixels is connected, via different reset transistors, to the control electrode of the amplifying transistor of another pixel or to a reset power supply line. Desirably, a plurality of reset transistors and the control electrodes of the amplifying transistors of the individual pixels can be alternately connected, and the control electrodes of the amplifying transistors of the pixels disposed at the ends are connected to the reset power supply lines via the corresponding reset transistors.

As shown in FIG. 2, the source region and the drain region of the reset MOS transistor 4 may be formed in the same semiconductor region as the control electrode region of the amplifying transistor 6. Alternatively, the control electrode region of the amplifying transistor 6 may be connected to the source region or the drain region of the reset MOS transistor 4 with wiring.

Subsequently, examples of modifications for the mode of the selection of pixels are described below. In the first embodiment, the conductivity type of the reset MOS transistor 4 is opposite to the conductivity type of the amplifying transistor 6. The coupling capacitor 8 is disposed between the gate electrode of the reset MOS transistor 4 and the control electrode 3. The potential change of the gate electrode of the reset MOS transistor 4 changes the potential of the control electrode 3 of the amplifying transistor 6 via the coupling capacitor 8. It is noted that the conductivity type of a transistor means the conductivity type of the main electrodes. For transistors having the same conductivity type, the types of carriers that carry the main electrode current are also the same. Alternatively, the reset MOS transistor 4 and the amplifying transistor 6 may be of the same conductivity type, and the selection of pixels may be performed by a selection transistor.

Then, examples of modifications for the drive method are described below. In the first embodiment, after reading out a signal from a selected pixel, both the reset MOS transistors 4a and 4c that are directly connected to the control electrode 3c of the selected pixel are set in the conductive state at time T3 in FIG. 8. However, only one of a pair of reset MOS transistors 4 sandwiching the control electrode 3 of a selected pixel may be set in the conductive state. This type of operation is desirable in a case, for example, where signals are sequentially read from pixels row by row. More specifically, the reset pulse Res2 is maintained at the low level during the period between T3 and T4 in FIG. 8.

In the driving operation in accordance with the pulses shown in FIG. 8, pixels are sequentially selected row by row. However, pixel rows may be selected randomly.

Figure 3:
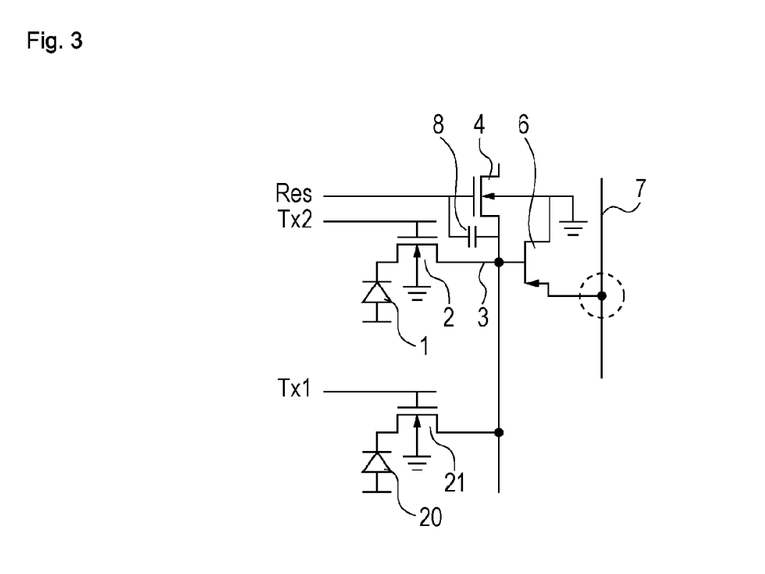
FIG. 3 is an equivalent circuit diagram illustrating pixels of a solid-state image pickup apparatus according to a second embodiment of the present invention.

FIG. 3 is an equivalent circuit diagram illustrating pixels in a solid-state image pickup apparatus according to a second embodiment of the present invention. In FIG. 3, there are shown a photodiode 20 and a transfer MOS transistor 21. The elements having the same functions as those shown in FIG. 1 are designated by like reference numerals, and a detailed explanation thereof is thus omitted.

In this embodiment, the two photodiodes 1 and 20 are connected to the control electrode 3 via the transfer MOS transistors 2 and 21, respectively. That is, in this embodiment, two pixels, each having one photodiode, share one amplifying transistor. In the arrangement of the pixels in this embodiment, the circuit surrounded by the broken lines in FIG. 1 is substituted with the circuit shown in FIG. 3.

The selection of a pixel to be subjected to a readout operation can be performed in a manner similar to that in the first embodiment. That is, the reset MOS transistors 4 sandwiching the control electrode 3 of a pixel to be selected are set in the non-conductive state so as to make the potential of the control electrode 3 be in the floating state, thereby selecting a row of pixels.

In this state, one of the transfer MOS transistors 2 and 21 is set in the conductive state, whereby a signal can be output from either of the two photodiodes 1 and 20, in which case, the photodiodes 1 and 20 are considered to be two different pixels. Alternatively, both the transfer MOS transistors 2 and 21 are set in the conductive state, whereby signals can be output from the two photodiodes 1 and 20, in which case, the photodiodes 1 and 20 are considered to be one pixel.

The resetting of the control electrodes 3 of pixels can be performed in a manner similar to that in the first embodiment. One of or both the reset MOS transistors 4 sandwiching the control electrode 3 of a pixel from which a signal has been read is/are set in the conductive state so that a reset potential is applied to the control electrode 3.

In FIG. 3, one set of the photodiode 1 and the transfer MOS transistor 2 and another set of the photodiode 20 and the transfer MOS transistor 21, i.e., two sets of photodiodes and transfer MOS transistors, share the same control electrode 3. However, three or more sets of photodiodes and transfer MOS transistors may share one control electrode.

In this embodiment, two sets of photodiodes and transfer MOS transistors share one control electrode. With this configuration, since it is sufficient that only one amplifying transistor is provided for a plurality of photoelectric conversion units, i.e., photodiodes, the area of the photoelectric conversion units can be made relatively large. Accordingly, the sensitivity of pixels can be enhanced. Particularly in a solid-state image pickup apparatus having a small pixel area, the advantage of the enhancement of sensitivity is noticeable because the aperture of wiring can be made large due to a smaller number of wiring lines. It is thus possible to provide a high-sensitivity, low-noise amplifying solid-state image pickup apparatus.

Figure 4:
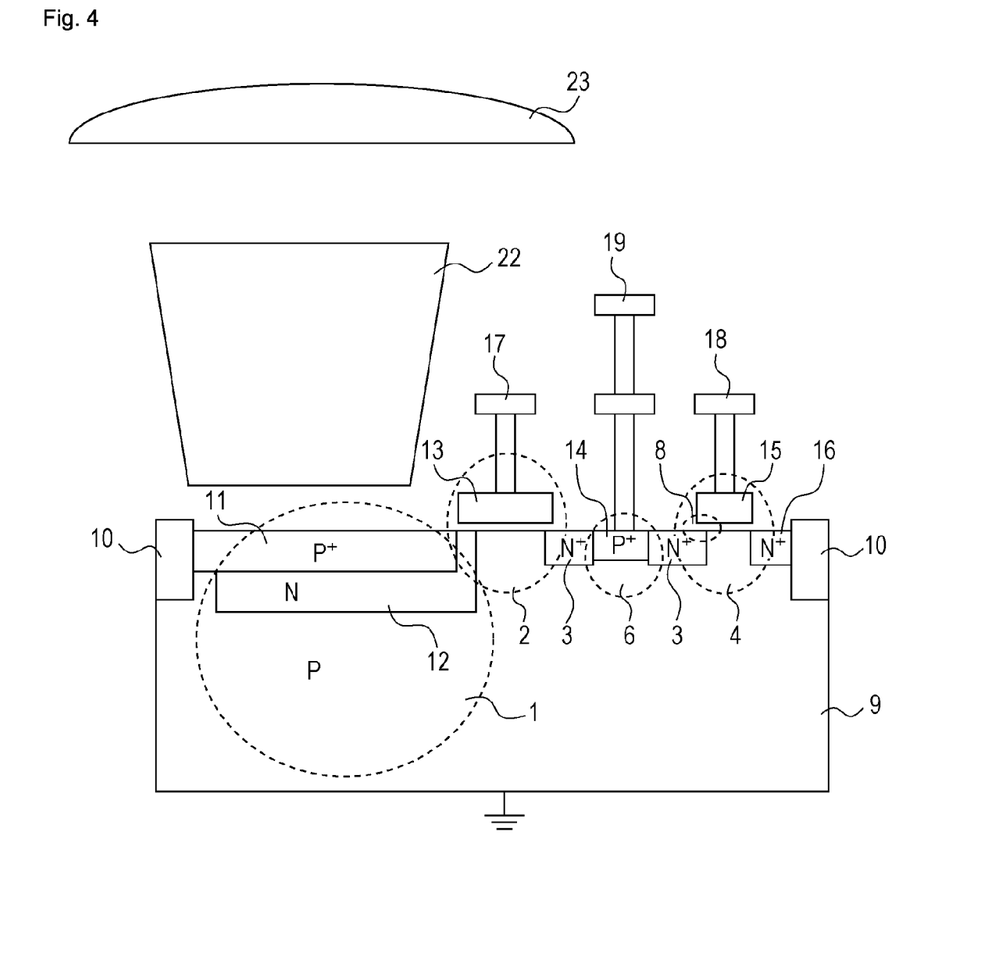
FIG. 4 is a sectional view illustrating the structure of a pixel of a solid-state image pickup apparatus according to a third embodiment of the present invention.

FIG. 4 is a sectional view schematically illustrating the pixel region in a solid-state image pickup apparatus according to a third embodiment of the present invention. In this embodiment, a light guide for guiding incident light is provided on the top of the photoelectric conversion unit 1. A light guide 22 for efficiently guiding incident light to the surface of the photodiode 1 is provided. A microlens 23 for converging incident light applied to the pixel onto the light guide 22 is also provided above the light guide 22. The elements having the functions similar to those shown in FIG. 2 are designated by like reference numerals. A detailed explanation is thus omitted.

In general solid-state image pickup apparatuses, the multi-layered wiring structure in which wiring lines are arranged in a plurality of layers is used. As shown in FIG. 4, the control lines 17 and 18 are arranged in a wiring layer different from the wiring layer in which the signal line 19 is arranged. An interlayer insulating film is disposed between these wiring layers.

In this embodiment, as the light guide 22 for efficiently guiding incident light to the photodiodes 1 of the individual pixels, a member having a higher level of index than the surrounding interlayer insulating film is disposed on the top of the photodiode 1. In order to fabricate such a structure, after the interlayer insulating film disposed on the photodiode 1 is opened in the form of a well, a member having a higher level of index than the interlayer insulating film may be buried into the opening. In terms of the ease of fabricating this well-type light guide 22 and the higher light convergence efficiency, it is desirable that the depth of the well with respect to the diameter of the well be small.

When applying this light guide structure to an APS, it is important to decrease the number of wiring lines per pixel with a view to reducing loss of light due to the interference of the wiring layers. If many wiring lines are provided, the diameter of the well becomes smaller since the wiring aperture is narrow, or the depth of the well becomes larger since many wiring layers are formed.

As discussed above, in this embodiment, the light guide 22 is disposed on the top of the photoelectric conversion unit 1. With this configuration, the quantity of light incident on the photoelectric conversion unit 1 is increased, thereby enhancing the sensitivity.

As in the first and second embodiments, in the third embodiment, the reset power supply lines are not disposed in the pixel region. As is seen from FIG. 4, in this embodiment, the GND potential, i.e., the drain potential of the P-type JFET 6, is supplied from the semiconductor substrate. With this configuration, the number of wiring lines can be decreased, whereby the depth of the well with respect to the diameter of the well can be made small. Accordingly, incident light can be efficiently guided to the photodiode 1, and thus, the sensitivity of pixels can be enhanced. Particularly in small-size pixels, the advantage of the enhancement of sensitivity is noticeable.

Figure 5:
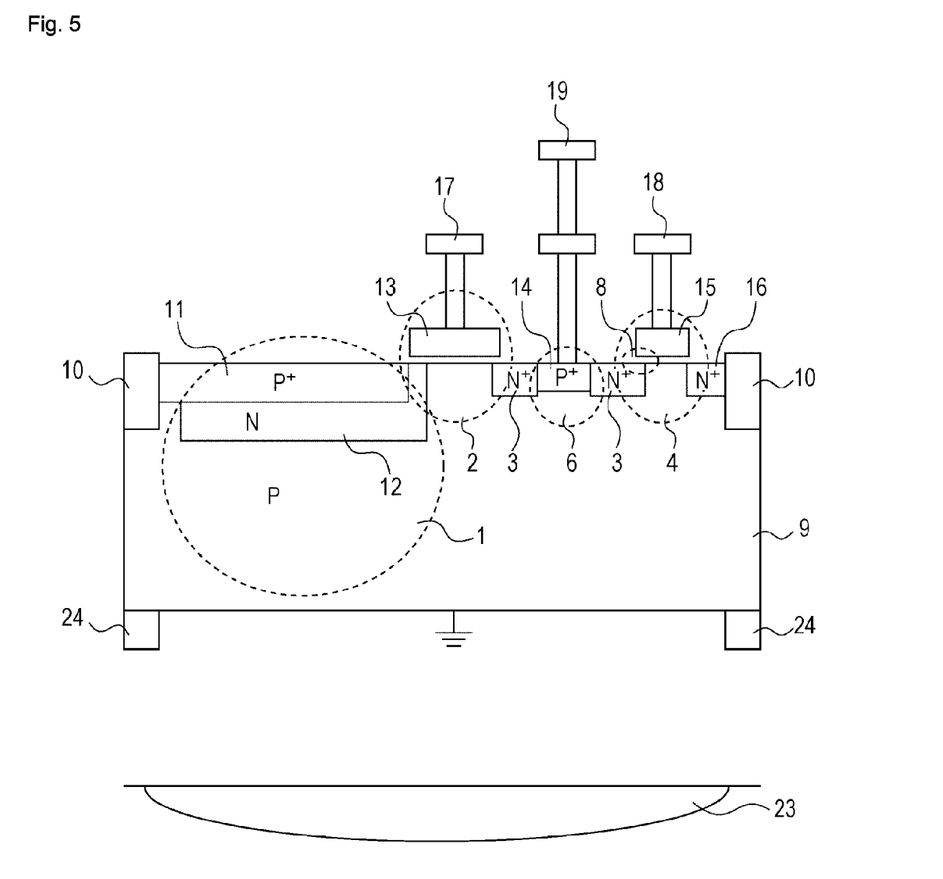
FIG. 5 is a sectional view illustrating the structure of a pixel of a solid-state image pickup apparatus according to a fourth embodiment of the present invention.

FIG. 5 is a sectional view schematically illustrating the pixel region in a solid-state image pickup apparatus according to a fourth embodiment of the present invention. Elements having the same functions as those shown in FIG. 4 are designated by like reference numerals, and a detailed explanation is thus omitted.

In the solid-state image pickup apparatus of this embodiment, light is incident on the photoelectric conversion unit 1, i.e., a photodiode, through the second main surface (backside) of the semiconductor substrate, which is opposite the first main surface (front side) on which wiring lines, such as output signal lines, are arranged. That is, this type of sensor is a back-illuminated sensor. More specifically, the microlens 23 for converging incident light onto the photodiode 1 is formed on the second main surface (backside) of the semiconductor substrate region 9. Inter-pixel isolation wiring patterns 24 are disposed for isolating the pixels, and also serve as GND power supply lines for supplying the GND potential to the semiconductor substrate region 9.

In this embodiment, since the solid-state image pickup apparatus is formed as a back-illuminated sensor, the aperture can be made large. With this configuration, in addition to the advantages attained by the first embodiment, the sensitivity of pixels can further be enhanced. Particularly in a solid-state image pickup apparatus having a small pixel area, the advantage of the enhancement of the sensitivity is noticeable.

The conductivity types of the elements forming the pixels may be opposite to those arranged in the foregoing embodiments. That is, carriers stored as a signal in the photodiode 1 are holes, the transfer MOS transistors 2 are of the P conductivity type, the control electrodes 3 are of the P conductivity type, the reset MOS transistors 4 are of the P conductivity type, and the JFETs 6 are of the N conductivity type. A solid-state image pickup apparatus having such pixels also forms the present invention.

Additionally, in the foregoing embodiments, the transfer transistor 2 is disposed in the path between the photodiode 1 and the control electrode 3. However, the photodiode 1 and the control electrode 3 may be directly connected to each other. Such a configuration is also applicable to the present invention.

As described above, in the solid-state image pickup apparatus of the present invention, the first reset transistor is disposed in the electrical path between the first reset power supply line and the control electrode of the first pixel. The second reset transistor is disposed in the electrical path between the control electrode of the first pixel and the control electrode of the second pixel. The third reset transistor is disposed in the electrical path between the control electrode of the second pixel and the second reset power supply line. Signals from the first pixel and the second pixel are not read out in parallel. With this configuration, the reset transistors 4 are set to be the conductive state, whereby the potential of the control electrode 3 of each pixel can be maintained at the potential of the reset power supply. Then, a pair of reset transistors 4 sandwiching the control electrode 3 of the pixel of a row to be selected are set to be non-conductive state, whereby a signal from the pixel can be read out. In the resetting operation after reading out a signal, it is sufficient that the control electrode region 3 of the amplifying transistor 6 of only one pixel is reset to the reset potential. Accordingly, parasitic capacitance and stray resistance can be small. Thus, a fast resetting operation can be implemented.

In the solid-state image pickup apparatus of the present invention, it is not necessary to provide a reset power supply line for each pixel. Accordingly, the area of the photo-electric conversion unit, such as a photodiode, can be made large. Additionally, with a small number of wiring lines, the aperture can be made large. With this configuration, the sensitivity of pixels can be enhanced.

In the above-described embodiments, the conductivity type of the reset transistor 4 is opposite to the conductivity type of the amplifying transistor 6. A voltage supplied to the gate electrode of the reset transistor 4 via the coupling capacitor 8 disposed between the control electrode 3 of the amplifying transistor 6 and the gate electrode of the reset transistor 4 can control the potential of the control electrode 3 of the amplifying transistor 6. With this configuration, a pixel from which a signal is read out can be selected without increasing the number of transistors, thereby making it possible to make the area of the photodiode 1 large. Thus, the sensitivity of the pixels can be enhanced.

Generally, N-type MOS transistors used as amplifying transistors of a complementary MOS (CMOS) sensor have large 1/f noise. With the use of N-type MOS transistors, noise resulting from the use of such amplifying transistors is added to signals read out from pixels. In the solid-state image pickup apparatus of the present invention, the amplifying transistors may be of the P conductivity type. With this configuration, 1/f noise can be smaller compared to that with the use of N-type MOS transistors, and thus, images with low noise can be captured.

If JFETs, SITs, or bipolar transistors are used as the amplifying transistors 6, the control electrodes 3 of the amplifying transistors 6 can be directly formed of the semiconductor region to which electric charge from the photoelectric conversion units 1 is transferred. Accordingly, it is not necessary to provide wiring that connects the semiconductor region and the control electrodes 3 of the amplifying transistors 6, thereby making it possible to make the area of the photodiodes large. Thus, the sensitivity of pixels can be enhanced.

Further, if the amplifying transistors 6 are JFETs or SITs, noise is smaller compared to that with the use of N-type MOS transistors. Thus, images with low noise can be captured.

Additionally, if the amplifying transistors 6 are JFETs or SITs, unlike bipolar transistors, the non-destructive readout operation is implemented. By the use of bipolar transistors that performs a destructive readout operation due to the use of a base current, noise occurs because of fluctuations of a destructive signal. In the case of JFETs or SITs, however, noise caused by signal fluctuations is small. Thus, images with low noise can be captured.

With the structure in which JFETs or SITs are used as the amplifying transistors 6, it is possible to provide an amplifying solid-state image pickup apparatus that exhibits a high signal-to-noise ratio even if the size of the pixels is small.

If bipolar transistors, JFETs, or SITs are used as the amplifying transistors 6, one of the main electrode regions of the amplifying transistor 6 can be formed in the semiconductor substrate region. The GND potential can also be supplied from the semiconductor substrate. Accordingly, the provision of power supply wiring can be made unnecessary. With this configuration, the number of elements forming a pixel is smaller compared to known configurations of pixels, and thus, the area of the photodiode 1 and the wiring aperture can be made larger.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-108786, filed May 10, 2010, which is hereby incorporated by reference herein in its entirety.

The invention claimed is:

1. A solid-state image pickup apparatus comprising:
a plurality of pixels arranged in a matrix, each including a photoelectric conversion unit and an amplifying transistor having a control electrode to which electric charge generated in the photoelectric conversion unit is transferred;
a plurality of output lines, signals from at least two pixels of the plurality of pixels being output, in parallel, to the plurality of output lines;
a first reset power supply unit and a second reset power supply unit configured to supply a voltage for resetting the control electrode of the amplifying transistor; and
a first reset transistor, a second reset transistor and a third reset transistor,
wherein:
the plurality of pixels include a first pixel and a second pixel, signals from the first pixel and the second pixel not being output in parallel;
the first reset transistor controls an electrical connection between the first reset power supply unit and the control electrode of the amplifying transistor of the first pixel;
the second reset transistor controls an electrical connection between the control electrode of the amplifying transistor of the first pixel and the control electrode of the amplifying transistor of the second pixel;
the third reset transistor controls an electrical connection between the control electrode of the amplifying transistor of the second pixel and the second reset power supply unit;
the amplifying transistor of the first pixel is of a first conductivity type, and the first reset transistor and the second reset transistor are of a second conductivity type which is opposite to the first conductivity type;
the control electrode of the amplifying transistor of the first pixel is connected to a main electrode of the first reset transistor and a main electrode of the second reset transistor;
a coupling capacitor is disposed, the coupling capacitor including a first node connected to the control electrode of the amplifying transistor of the first pixel and a second node connected to a control electrode of the first or second reset transistor;
the amplifying transistor is disposed in an electrical path from a power supply node to one of the output line without an intervening transistor to select the pixel; and
a voltage supplied to the control electrode of the first or second reset transistor controls a potential of the control electrode of the amplifying transistor of the first pixel via the coupling capacitor such that the first pixel is selected to be readout by turning off both of the first and second reset transistors.

2. The solid-state image pickup apparatus according to claim 1, wherein the amplifying transistor of the first pixel is of a P-channel-type.

3. The solid-state image pickup apparatus according to claim 1, wherein:
the first reset power supply unit includes a first reset power supply line;
the second reset power supply unit includes a second reset power supply line; and
the first reset power supply line and the second reset power supply line are disposed outside a pixel region.

4. The solid-state image pickup apparatus according to claim 1, wherein each of the plurality of pixels includes a transfer transistor configured to transfer the electric charge generated in the photoelectric conversion unit to the control electrode of the amplifying transistor.

5. The solid-state image pickup apparatus according to claim 1, wherein each of the plurality of pixels includes a plurality of photoelectric conversion units and a plurality of transfer transistors configured to transfer electric charge generated in the plurality of photoelectric conversion units to a control electrode of one amplifying transistor.

6. The solid-state image pickup apparatus according to claim 1, wherein a light guide is disposed on the photoelectric conversion unit so as to guide incident light to the photoelectric conversion unit.

7. The solid-state image pickup apparatus according to claim 1, further comprising a semiconductor substrate on which the photoelectric conversion unit is disposed, wherein the solid-state image pickup apparatus is a back-illuminated type configured such that the plurality of output lines are disposed on a first main surface of the semiconductor substrate and light is incident on the photoelectric conversion unit through a second main surface, which is opposite the first main surface, of the semiconductor substrate.

8. The solid-state image pickup apparatus according to claim 1, wherein the amplifying transistor of the first pixel is one of a junction field effect transistor, a bipolar transistor, and a static induction transistor.

9. The solid-state image pickup apparatus according to claim 8, further comprising a semiconductor region in which the amplifying transistor of the first pixel and the reset transistor are disposed, wherein a voltage is supplied to one of main electrode regions of the amplifying transistor of the first pixel via the semiconductor region.

10. The solid-state image pickup apparatus according to claim 1, wherein:
   at least two output lines of the plurality of output lines are disposed in association with one column of the pixels arranged in a matrix;
   the plurality of pixels include a third pixel contained in a row different from a row of the first pixel;
   signals from the first pixel and the third pixel are output to the at least two output lines in parallel;
   one of main electrodes of the second reset transistor is connected to the control electrode of the amplifying transistor of the first pixel, and the other main electrode of the second reset transistor is connected to the control electrode of the amplifying transistor of the third pixel; and
   the solid-state image pickup apparatus further comprises a fourth reset transistor configured to control an electrical connection between the control electrode of the amplifying transistor of the third pixel and the control electrode of the amplifying transistor of the second pixel.

11. A solid-state image pickup apparatus comprising:
   a first pixel and a second pixel, each including a photoelectric conversion unit and an amplifying transistor having a control electrode to which electric charge generated in the photoelectric conversion unit is transferred;
   an output line to which signals from the first pixel and the second pixel are output;
   a first reset power supply unit and a second reset power supply unit configured to supply a voltage for resetting the control electrode of the amplifying transistor;
   a first reset transistor configured to control an electrical connection between the first reset power supply unit and the control electrode of the amplifying transistor of the first pixel;
   a second reset transistor configured to control an electrical connection between the control electrode of the amplifying transistor of the first pixel and the control electrode of the amplifying transistor of the second pixel;
   a third reset transistor configured to control an electrical connection between the control electrode of the amplifying transistor of the second pixel and the second reset power supply unit;
   the amplifying transistor of the first pixel is of a first conductivity type, and the first reset transistor and the second reset transistor are of a second conductivity type which is opposite to the first conductivity type;
   the control electrode of the amplifying transistor of the first pixel is connected to a main electrode of the first reset transistor and a main electrode of the second reset transistor;
   a coupling capacitor is disposed, the coupling capacitor including a first node connected to the control electrode of the amplifying transistor of the first pixel and a second node connected to a control electrode of the first or second reset transistor;
   the amplifying transistor is disposed in an electrical path from a power supply node to one of the output line without an intervening transistor to select the pixel; and
   a voltage supplied to the control electrode of the first or second reset transistor controls a potential of the control electrode of the amplifying transistor of the first pixel via the coupling capacitor such that the first pixel is selected to be readout by turning off both of the first and second reset transistors.

12. The solid-state image pickup apparatus according to claim 11, further comprising:
   a third pixel and a fourth pixel;
   an output line to which signals from the third pixel and the fourth pixel are output, the output line being different from the output line to which signals from the first pixel and the second pixel are output;
   a fourth reset transistor configured to control an electrical connection between the first reset power supply unit and a control electrode of an amplifying transistor of the third pixel;
   a fifth reset transistor configured to control an electrical connection between the control electrode of the amplifying transistor of the third pixel and a control electrode of an amplifying transistor of the fourth pixel; and
   a sixth reset transistor configured to control an electrical connection between the control electrode of the amplifying transistor of the fourth pixel and the second reset power supply unit.

13. The solid-state image pickup apparatus according to claim 12, wherein the amplifying transistor of the first pixel is a P-channel-type transistor.

14. The solid-state image pickup apparatus according to claim 12, wherein the amplifying transistor is one of a junction field effect transistor, a bipolar transistor, and a static induction transistor.

* * * * *